United States Patent
Zheng et al.

(10) Patent No.: US 6,902,629 B2
(45) Date of Patent: *Jun. 7, 2005

(54) METHOD FOR CLEANING A PROCESS CHAMBER

(75) Inventors: Yi Zheng, San Jose, CA (US); Vinita Singh, Mountain View, CA (US); Srinivas D. Nemani, San Jose, CA (US); Chen-An Chen, Milpitas, CA (US); Ju-Hyung Lee, Campbell, CA (US); Shankar Venkataraman, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 468 days.

This patent is subject to a terminal disclaimer.

(21) Appl. No.: 10/122,481

(22) Filed: Apr. 12, 2002

(65) Prior Publication Data

US 2003/0192568 A1 Oct. 16, 2003

(51) Int. Cl.$^7$ .................................................. B08B 5/00
(52) U.S. Cl. ..................... 134/31; 134/1.1; 134/22.1; 134/22.18; 134/26; 134/30; 134/902; 216/63; 216/67; 216/68; 438/905
(58) Field of Search ................ 134/1.1, 22.1, 134/22.18, 26, 30, 31, 902; 216/63, 67, 68; 438/905

(56) References Cited

U.S. PATENT DOCUMENTS

| | | | |
|---|---|---|---|
| 5,158,644 A | 10/1992 | Cheung et al. ............. 156/643 |
| 5,207,836 A | 5/1993 | Chang ............................ 134/1 |
| 5,449,411 A | 9/1995 | Fukuda et al. ........ 118/723 MP |
| 5,454,903 A | 10/1995 | Redeker et al. ............... 216/67 |
| 5,558,717 A | 9/1996 | Zhao et al. .................. 118/715 |
| 5,788,778 A | 8/1998 | Shang et al. .................... 134/1 |
| 5,824,375 A | 10/1998 | Gupta ........................ 427/569 |
| 5,844,195 A | 12/1998 | Fairbairn et al. ...... 219/121.43 |
| 5,882,411 A | 3/1999 | Zhao et al. .................. 118/715 |
| 5,886,473 A | 3/1999 | Watanabe et al. |
| 6,067,999 A | 5/2000 | Hines et al. .................. 134/1.1 |
| 6,107,192 A | 8/2000 | Subrahmanyan et al. |
| 6,125,859 A | 10/2000 | Kao et al. ..................... 134/1.1 |
| 6,164,295 A | 12/2000 | Ui et al. |
| 6,176,198 B1 | 1/2001 | Kao et al. ............. 118/723 ME |
| 6,255,222 B1 | 7/2001 | Xia et al. .................... 438/710 |
| 6,271,148 B1 * | 8/2001 | Kao et al. .................... 438/727 |
| 6,274,058 B1 | 8/2001 | Rajagopalan et al. ......... 216/67 |
| 6,379,575 B1 * | 4/2002 | Yin et al. ...................... 216/67 |
| 6,432,255 B1 * | 8/2002 | Sun et al. ................ 118/723 E |
| 6,435,197 B2 | 8/2002 | Shin et al. |
| 6,437,512 B1 | 8/2002 | Chen et al. |
| 6,461,975 B1 | 10/2002 | Jeong et al. |
| 6,569,257 B1 | 5/2003 | Nguyen et al. |
| 6,736,147 B2 * | 5/2004 | Satoh et al. ................. 134/1.1 |
| 2001/0025645 A1 | 10/2001 | Shin et al. |
| 2002/0052114 A1 | 5/2002 | Marks |
| 2002/0104467 A1 | 8/2002 | Chandran et al. |
| 2002/0117473 A1 | 8/2002 | Yanase |
| 2003/0010355 A1 | 1/2003 | Nowak et al. ............... 134/1.1 |

FOREIGN PATENT DOCUMENTS

| | | |
|---|---|---|
| EP | 0 555 546 A1 | 8/1993 |
| EP | 0 697 467 A1 | 2/1996 |
| EP | 1 118 692 A1 | 7/2001 |
| EP | 1 304 731 A1 | 4/2003 |
| WO | WO 02/012587 A2 | 2/2002 |
| WO | WO 02/078073 A1 | 4/2003 |

* cited by examiner

*Primary Examiner*—M. Kornakov
(74) *Attorney, Agent, or Firm*—Moser, Patterson & Sheridan

(57) ABSTRACT

Methods and apparatus for cleaning deposition chambers are presented. The cleaning methods include the use of a remote plasma source to generate reactive species from a cleaning gas to clean deposition chambers. A flow of helium or argon may be used during chamber cleaning. Radio frequency power may also be used in combination with a remote plasma source to clean deposition chambers.

32 Claims, 1 Drawing Sheet

US 6,902,629 B2

METHOD FOR CLEANING A PROCESS CHAMBER

BACKGROUND OF THE INVENTION

1. Field of the Invention

Embodiments of the present invention generally relate to methods of cleaning a deposition chamber using a remote plasma source.

2. Description of the Related Art

In the fabrication of integrated circuits and semiconductor devices, materials such as oxides are typically deposited on a substrate in a process chamber, such as a deposition chamber, such as a chemical vapor deposition (CVD) chamber. The deposition processes typically result in deposition of some of the material on the walls and components of the deposition chamber. The material deposited on the chamber walls and components can affect the deposition rate from substrate to substrate and the uniformity of the deposition on the substrate.

Several methods of cleaning a deposition chamber have been developed. For example, a remote plasma source can be used to provide a source of free radicals, such as fluorine radicals, that react with deposited material in the deposition chamber, forming volatile compounds that can be removed from the deposition chamber. However, cleaning a deposition chamber using known remote plasma sources is a time consuming process. Remote plasma sources typically provide free radicals at a flow rate and an intensity that do not result in a level of free radical or ion bombardment that can damage the deposition chamber. However, more time is required to clean a chamber when a low intensity cleaning process such as a remote plasma clean process is used. A lengthy chamber cleaning period decreases the number of substrates that can be processed in a given time, since the chamber cannot be used for deposition during the cleaning period.

Providing in situ radio frequency (RF) power in the deposition chamber to generate a plasma of cleaning gases is another method that can be used to clean a deposition chamber. Reactive species generated in the plasma bombard and react with deposited material in the deposition chamber, forming volatile compounds that can be removed from the deposition chamber. The reactive species can also bombard the chamber and remove deposited material from the chamber surfaces. However, the reactive species often damage the chamber due to the energy imparted to the species in the chamber. Furthermore, the reactive species can react with the material forming the chamber lining and create undesirable contaminants that may land on and harm a substrate undergoing processing in the chamber. For example, if $NF_3$ is introduced into a chamber, the fluorine ions generated in the plasma can combine with aluminum used as a lining material in the deposition chamber and form particles of aluminum fluoride.

The removal of contaminating particles from a deposition chamber is becoming increasingly important because the device sizes are becoming smaller and aspect ratios are becoming more aggressive. With smaller feature sizes and more aggressive aspect ratios, the size and number of contaminating particles must be minimized in order to maintain the performance of the device.

Therefore, there remains a need for a method of cleaning deposition chambers efficiently, while minimizing contaminant generation. Additionally, the development of new materials, such as carbon-doped oxides having low dielectric constants, which can serve as components of integrated circuits, has created a need for a method of cleaning chambers that are used to deposit the new materials which can be more difficult to remove from chamber surfaces than other dielectric materials, such as oxides.

SUMMARY OF THE INVENTION

Embodiments of the present invention generally relate to methods of cleaning a deposition chamber. Deposition chambers used to deposit carbon-doped silicon oxides, as well as other dielectric materials, on substrates during semiconductor fabrication can be cleaned using the methods described herein.

In one embodiment, a method of cleaning a processing region of a deposition chamber, comprises generating reactive species, such as free radicals, in a remote plasma source connected to the deposition chamber by striking a plasma comprising free radicals, such as from a free radical source, such as a cleaning gas. The plasma is struck using a power of about 2 kilowatts or greater in the remote plasma source. After the plasma is struck, the remote plasma source provides between about 5 kilowatts and about 8 kilowatts of power to the struck plasma. Helium and the activated cleaning gas are introduced into the processing region of the deposition chamber. The cleaning gas is flowed into the processing region at a rate of about 300 sccm or greater. Radio frequency (RF) power is delivered to the processing region to sustain a sufficient number of free radicals to clean the processing region of the chamber. The reactive species of the activated cleaning gas react with deposited material in the processing region of the chamber to form volatile compounds that can be removed from the deposition chamber.

In another aspect, a two step chamber cleaning method is provided. The first chamber cleaning step includes providing and sustaining a plasma of reactive species using a remote plasma source and a source of radio frequency power within the chamber to be cleaned, i.e., an in situ plasma source. The second chamber cleaning steps includes providing and sustaining the plasma of the first step using the remote plasma source, but not the in situ plasma source. In one embodiment, a method of cleaning a processing region of a deposition chamber comprises introducing an inert gas and a cleaning gas into a remote plasma source connected to the deposition chamber. A plasma is struck in the remote plasma source. The plasma comprises reactive species, such as free radicals from the cleaning gas. The activated cleaning gas is introduced into the processing region of the deposition chamber. Radio frequency (RF) power is delivered to the processing region to sustain a sufficient number of free radicals to clean the processing region of the chamber. The radio frequency power is then terminated. The chamber is then cleaned for a period of time using the reactive species generated by the plasma that is provided and sustained by the remote plasma source. Both during and after the radio frequency power is delivered to the processing region, the reactive species of the activated cleaning gas react with deposited material in the processing region of the chamber to form volatile compounds that can be removed from the deposition chamber.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
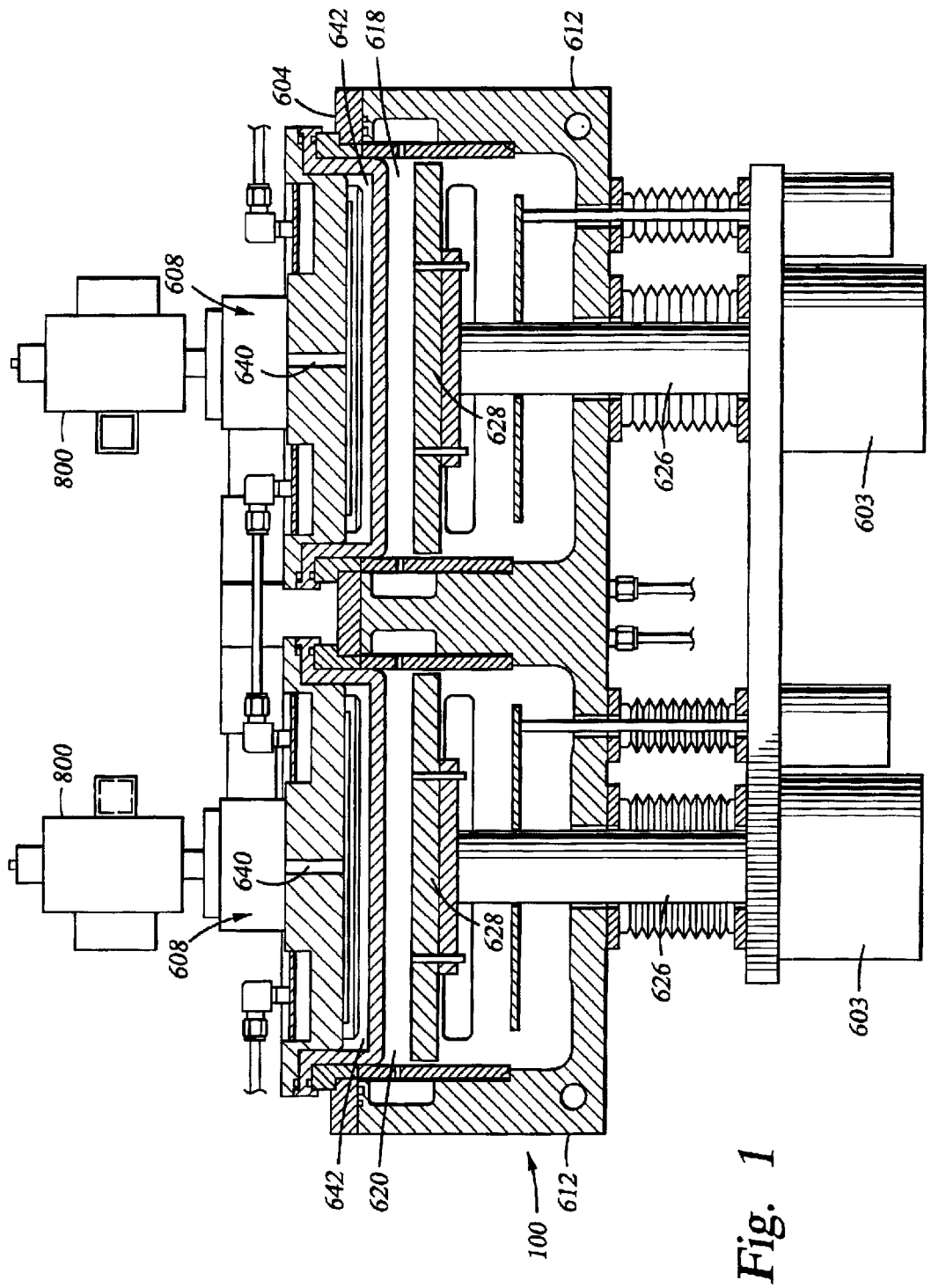
FIG. 1 is a cross sectional view of one embodiment of a deposition chamber.

The present invention generally provides methods and apparatus for cleaning deposition chambers, such as deposition chambers used in the fabrication of integrated circuits and semiconductor devices. The deposition chambers that may be cleaned using the methods described herein include chambers that may be used to deposit oxides, such as carbon-doped silicon oxides, and other dielectric materials. An example of a chamber that may be cleaned using the methods described herein is the Producer® Chamber, available from Applied Materials, Inc. of Santa Clara, Calif. The Producer® Chamber is a CVD chamber with two isolated processing regions that may be used to deposit carbon-doped silicon oxides and other materials. A chamber having two isolated processing regions is described in U.S. Pat. No. 5,855,681, which is incorporated by reference herein. The Producer® Chamber has a port to which remote plasma sources may be attached. A Producer® Chamber with a remote plasma source, model number 5707024-F, available from Advanced Energy Industries, Inc., of Fort Collins, Colo., may be used in embodiments of the methods described herein. In the embodiments described herein, one remote plasma source may be attached to a Producer® Chamber such that remote plasma source is connected to both isolated processing regions of the Producer® Chamber. However, the processes described below may also be performed by using two remote plasma sources connected, such as via a tee line, to each processing region of the Producer® Chamber, and adjusting the flow rates accordingly. The gas flow rates described below refer to flow rates experienced by each of the isolated processing regions. Thus, the gas flow rates experienced by the Producer® Chamber as a whole, i.e., the combination of both of the isolated processing regions, are approximately twice the gas flow rates experienced by each of the isolated processing regions. While some examples of embodiments are described with respect to cleaning a processing region of a Producer® Chamber that has two processing regions, the methods described herein may be used to clean a processing region of a chamber that has one or more processing regions.

An example of a chamber that has two processing regions is shown in FIG. 1. FIG. 1 shows a cross sectional view of a chamber 100 that is connected to two remote plasma sources 800. The chamber 100 has processing regions 618 and 620. One remote plasma source 800 is connected to processing region 618, and the other remote plasma source 800 is connected to processing region 620. A heater pedestal 628 is movably disposed in each processing region 618, 620 by a stem 626 which extends through the bottom of the chamber body 612 where it is connected to a drive system 603. Each of the processing regions 618, 620 also preferably include a gas distribution assembly 608 disposed through the chamber lid 604 to deliver gases into the processing regions 618, 620. The gas distribution assembly 608 of each processing region also includes a gas inlet passage 640 which delivers gas into a shower head assembly 642.

In various embodiments described herein, the remote plasma source that is used in the various chamber cleaning methods has a maximum power of between about 5 kilowatts (kW) and about 8 kilowatts. Other prior remote plasma sources have lower maximum powers. A remote plasma source with a higher power can generate a hotter plasma, and thus, more radicals to clean the chamber. A remote plasma source with a higher power can provide enough power to produce a larger number of free radicals than a remote plasma source with a lower power. While some free radicals from a remote plasma source with a higher power may recombine into other molecules, which are typically not as effective as free radicals for cleaning a chamber, a remote plasma source with a higher power can provide enough free radicals that a sufficient number of free radicals will be present to clean the chamber in spite of recombination.

The remote plasma source used in the chamber cleaning methods described herein is typically capable of delivering and sustaining a free radical source, such as a cleaning gas, such as a halogen-containing gas, e.g., $NF_3$, at higher flow rates than prior remote plasma sources. For example, the remote plasma source used herein may deliver and sustain a cleaning gas, such as $NF_3$, at a flow rate of up to and including about 1500 sccm (standard cubic centimeters per minute) to a processing region of the chamber when argon is also flowed to the processing region. The argon may be flowed into the remote plasma source and then into the processing region. Some prior remote plasma sources typically deliver and sustain a maximum of about 1000 sccm of a cleaning gas, when argon is also flowed into the processing region. When argon is not flowed into the processing region, the remote plasma source used herein may deliver and sustain a cleaning gas, such as $NF_3$, flow rate of up to and including about 1000 sccm to the processing region. When argon is not flowed into the processing region, some prior remote plasma sources typically deliver and sustain a maximum of about 250 sccm of a cleaning gas. Thus, the remote plasma source used herein can deliver and sustain a free radical source, such as a cleaning gas, at a higher flow rate than some prior remote plasma sources. Furthermore, the remote plasma source used herein does not require a flow of argon to deliver and sustain a high flow rate, such as between about 1000 sccm and about 1500 sccm, of a free radical source. Higher flow rates of a free radical source, such as a cleaning gas, to the processing region of the chamber to be cleaned are generally correlated with faster cleaning times.

Another characteristic of the remote plasma source used in the chamber cleaning methods described herein is the remote plasma source's ability to be used without a flow of argon from the remote plasma source into the processing region of the chamber. Prior remote plasma sources typically require the use of argon to sustain a plasma that is necessary for chamber cleaning. The remote plasma source used herein may be used with a flow of helium from a separate gas source into the processing region instead of a flow of argon from the remote plasma source into the processing region. Prior remote plasma sources typically do not provide enough power to ionize helium or pure $NF_3$ to strike a stable helium or $NF_3$ plasma. Argon is typically easier to ionize than helium or $NF_3$. A cleaning method using helium flow rather than or in addition to argon flow may be preferred because the chamber is less likely to be damaged by the lighter and smaller helium.

In all of the embodiments of chamber cleaning methods described herein, the cleaning gas may be a halogen-containing gas, such as a fluorine-containing gas. Preferably, the cleaning gas is $NF_3$. The processing conditions and ranges described herein for cleaning gases can be used with $NF_3$. Other cleaning gases that can be used include $F_2$, $C_2F_4$, $SF_6$, $C_2F_6$, $CCl_4$, and $C_2Cl_6$.

In one embodiment of a chamber cleaning method, a plasma is struck in a remote plasma source that is connected to a deposition chamber. Argon and a free radical source, such as a cleaning gas, are introduced into the remote plasma source. Reactive species, such as free radicals, are generated in the remote plasma source connected to the deposition chamber. Argon is used to strike a plasma in the remote plasma source. A flow of argon, such as a flow rate of several hundred sccm, such as about 300 sccm to about 2000 sccm of argon, for about two seconds, into the remote plasma source is used to strike the plasma. After the plasma is struck, the flow of argon into the remote plasma source is continued. The plasma comprises argon and free radicals from the free radical source, such as a cleaning gas. Preferably, the cleaning gas is or includes $NF_3$. Preferably, most or all of the cleaning gas in the plasma is dissociated into free radicals, such as fluorine radicals if a fluorine-containing gas is used. The power that is used to strike the plasma is about 2 kilowatts or greater, preferably between about 2 kilowatts to about 3 kilowatts, and more preferably, about 3 kilowatts or about half of the maximum power of the remote plasma source. Once the plasma is struck, the remote plasma source delivers about 5 to about 8 kilowatts, e.g., about 6 kilowatts of power, to sustain the plasma. The argon and the cleaning gas that is preferably substantially in the form of free radicals are then introduced into a processing region of the chamber from the remote plasma source. Preferably, the cleaning gas is flowed into the processing region at a rate of about 500 sccm or greater. More preferably, the cleaning gas is flowed into the processing region at a rate of between about 500 sccm and about 1500 sccm. Even more preferably, the cleaning gas is introduced into the processing region at a rate of about 1500 sccm. Preferably, the argon is introduced into the processing region at a rate of between about 500 sccm and about 1500 sccm. The free radicals from the cleaning gas react with material deposited on the surfaces of the processing region of the deposition chamber to form volatile compounds that can be removed from the deposition chamber. It is believed that the described gas flow rates and/or power levels used may contribute to a good, efficient cleaning process that minimizes damage to the deposition chamber. It is believed that the inert gas argon contributes to the cleaning process by diluting the free radicals, and thus reducing the amount of recombination between the free radicals. Using this embodiment of a chamber cleaning method, carbon-doped silicon oxides can be removed from the interior surfaces of a processing region of a chamber. Furthermore, using this embodiment of a chamber cleaning method, carbon-doped silicon oxides and other materials deposited on the interior surfaces of a processing region may be removed from the interior surfaces at a rate of between about 1 $\mu$m/minute and about 5 $\mu$m/minute. Preferably, the removal rate is between about 2 and about 4 $\mu$m/minute. The removal rates are estimated by measuring the amount of deposited material that remains on a substrate that has received material during a deposition process in a processing region of the chamber and lost material during the chamber cleaning process. These removal rates are higher than a removal rate of 1.9 $\mu$m/minute obtained using a less powerful remote plasma source under similar conditions. Less time is required for chamber cleaning when a cleaning process with a higher removal rate is used.

In another embodiment of a chamber cleaning method, a plasma is struck in a remote plasma source that is connected to a deposition chamber. Argon and a free radical source, such as a cleaning gas, are introduced into the remote plasma source. Reactive species, such as free radicals, are generated in the remote plasma source connected to the deposition chamber. Argon is used to strike a plasma in the remote plasma source. A flow of argon, such as a flow rate of several hundred sccm, such as about 300 sccm to about 2000 sccm of argon, for about two seconds, into the remote plasma source is used to strike the plasma. The plasma comprises free radicals from the free radical source, such as a cleaning gas. Preferably, the cleaning gas is or includes $NF_3$. Preferably, most or all of the cleaning gas in the plasma is dissociated into free radicals, such as fluorine radicals if a fluorine-containing gas is used. The power that is used to strike the plasma is about 2 kilowatts or greater, preferably between about 2 kilowatts to about 3 kilowatts, and more preferably, about 3 kilowatts or about half of the maximum power of the remote plasma source. Once the plasma is struck, the remote plasma source delivers about 5 to about 8 kilowatts, e.g., about 6 kilowatts of power, to sustain the plasma. The cleaning gas that is preferably substantially in the form of free radicals is then introduced into the chamber from the remote plasma source. Preferably, the cleaning gas is flowed into a processing region of the chamber at a rate of about 300 sccm or greater. An argon flow is not required to introduce the cleaning gas into the processing region of the chamber, and thus, the cleaning gas may be introduced without an argon flow. A radio frequency (RF) power is then delivered to the processing region by energizing an RF source connected between two electrodes in the processing region. The two electrodes will normally respectively comprise the substrate support member or susceptor, and the face-plate or "showerhead" through which a cleaning gas is distributed into the processing region and which is directly connected to the RF power source. Preferably, the cleaning gas is flowed into the processing region at a rate of between about 300 sccm and about 2000 sccm. More preferably, the cleaning gas is flowed into the processing region at a rate of between about 625 sccm and about 1000 sccm. More preferably, the cleaning gas is flowed at a rate of between about 625 sccm and about 875 sccm. Preferably, the radio frequency power delivered to the processing region is between about 150 watts and about 700 watts. More preferably, the radio frequency power delivered to the processing region is about 200 watts. The free radicals from the cleaning gas react with material deposited on the surfaces of the processing region of the deposition chamber to form volatile compounds that can be removed from the deposition chamber. It is believed that the described gas flow rates and/or power levels used may contribute to a good, efficient cleaning process that minimizes damage to the deposition chamber. It is believed that the radio frequency power contributes to the cleaning process by sustaining a sufficient number of free radicals to clean the chamber. Using this embodiment of a chamber cleaning method, carbon-doped silicon oxides can be removed from the interior surfaces of a processing region of a chamber. Furthermore, using this embodiment of a chamber cleaning method, carbon-doped silicon oxides and other materials deposited on the interior surfaces of a processing region of a chamber may be removed from the interior surfaces at a rate of between about 2 $\mu$m/minute and about 3 $\mu$m/minute. A removal rate of 2.6 $\mu$m/minute may be obtained using a prior remote plasma source and radio frequency power. However, the prior remote plasma source required a flow of argon with the plasma. Furthermore, as shown in Table 1, the prior remote plasma source, argon, and radio frequency power process can result in the formation of an average of 57 contaminating particles, while the combination of the current remote plasma source and radio frequency power (RF3) may form an average of 19 particles. Cleaning processes that produce fewer contaminating particles are preferable because such processes reduce the probability that a contaminating particle will damage or destroy a substrate in the deposition chamber.

In another embodiment, the chamber cleaning method generally includes the use of a remote plasma source, helium, and radio frequency power delivered to the chamber to maintain a plasma therein. An inert gas, such as argon, and a free radical source, such as a cleaning gas, are introduced into the remote plasma source. Reactive species, such as free radicals, are generated in the remote plasma source connected to the deposition chamber. Argon is used to strike a plasma in the remote plasma source. A flow of argon, such as a flow rate of several hundred sccm, such as about 300 sccm to about 2000 sccm of argon, for about two seconds, into the remote plasma source is used to strike the plasma. The plasma comprises free radicals from the free radical source, such as a cleaning gas. Preferably, the cleaning gas is or includes $NF_3$. Preferably, most or all of the cleaning gas in the plasma is dissociated into free radicals, such as fluorine radicals if a fluorine-containing gas is used. The power that is used to strike the plasma is about 2 kilowatts or greater, preferably between about 2 kilowatts to about 3 kilowatts, and more preferably, about 3 kilowatts or about half of the maximum power of the remote plasma source. Once the plasma is struck, the remote plasma source delivers about 5 to about 8 kilowatts, e.g., about 6 kilowatts of power, to sustain the plasma. Helium may be introduced into the chamber via a separate gas line or from the remote plasma source. The cleaning gas that is preferably substantially in the form of free radicals is introduced into the chamber from the remote plasma source. Preferably, the cleaning gas is flowed into a processing region of the chamber at a rate of about 250 sccm or greater. An argon flow is not required to introduce the cleaning gas into the processing region of the chamber, and thus, the cleaning gas may be introduced without an argon flow, except for the argon used to strike the plasma. However, in an embodiment in which a remote plasma source such as the Astron Atomic fluorine generator AX7685, available from MKS ASTeX® Products of Wilmington, Mass., is used, argon is not required to strike the plasma, and thus, argon is not used in such an embodiment of a cleaning process. A radio frequency (RF) power is then delivered to the processing region by energizing an RF source connected between two electrodes in the processing region. The two electrodes will normally respectively comprise the substrate support member or susceptor, and the face-plate or "showerhead" through which a cleaning gas is distributed into the processing region and which is directly connected to the RF power source. Preferably, the cleaning gas is flowed into the processing region at a rate of between about 250 sccm and about 2000 sccm. More preferably, the cleaning gas is flowed at a rate of between about 250 sccm and about 1250 sccm. Preferably, the helium is introduced into the processing region at a rate of between about 125 sccm and about 2500 sccm. Preferably, the radio frequency power delivered to the processing region is between about 150 watts and about 1000 watts, such as between about 250 watts and about 350 watts. The free radicals from the cleaning gas react with material deposited on the surfaces of processing region of the deposition chamber to form volatile compounds that can be removed from the deposition chamber. It is believed that the described gas flow rates and/or power levels used may contribute to a good, efficient cleaning process that minimizes damage to the deposition chamber. It is believed that the inert gas helium contributes to the cleaning process by diluting the free radicals, and thus reducing the amount of recombination between the free radicals. It is also believed that the helium contributes to the cleaning process by bombarding the deposition chamber and removing deposited material from the chamber surfaces. It is believed that the chamber receives less damage from helium bombardment than from bombardment with heavier and larger argon typically used in other methods of chamber cleaning. Furthermore, it is believed that the radio frequency power contributes to the cleaning process by sustaining a sufficient number of free radicals to clean the chamber. Using this embodiment of a chamber cleaning method, carbon-doped silicon oxides can be removed from the interior surfaces of processing region of a chamber. Furthermore, using this embodiment of a chamber cleaning method, carbon-doped silicon oxides and other materials deposited on the interior surfaces of a chamber may be removed from the interior surfaces of a processing region of a chamber at a rate of between about 2 $\mu$m/minute and about 5 $\mu$m/minute.

Optionally, a chamber cleaning embodiment may further include a period of cleaning in which the radio frequency power in the chamber is not used. After the helium and the cleaning gas are introduced into the processing region of the chamber and a radio frequency power is applied to the processing region of the chamber, as described above, the radio frequency power is terminated. The chamber is then treated for a period of cleaning using a flow of argon rather than helium. The flow of helium is terminated, and argon is introduced into the remote plasma source. Argon and cleaning gas are then flowed from the remote plasma source into the processing region. Preferably, the cleaning gas is flowed into the processing region at a rate of between about 250 sccm and about 1250 sccm when the argon is introduced into the processing region. Preferably, the argon is introduced into the processing region at a rate of between about 250 sccm and about 2500 sccm. Using this embodiment of a chamber cleaning method, carbon-doped silicon oxides and other materials can be removed from the interior surfaces of a processing region of a chamber. Furthermore, using this embodiment of a chamber cleaning method, carbon-doped silicon oxides and other materials deposited on the interior surfaces of a chamber may be removed from the interior surfaces of processing region of a chamber at a rate of between about 2 $\mu$m/minute and about 4 $\mu$m/minute.

TABLE 1

| RPS Unit and Clean Recipe | Etch Rate on Substrate ($\mu$m/min) | $NF_3$ Flow Rate (sccm) | Clean Time (1 $\mu$m) | Est. Through-put wph | $NF_3$ Usage (scc) | Particles (>0.2 $\mu$m) |
|---|---|---|---|---|---|---|
| Prior RPS/Argon | 1.9 | 1000 | 360 s | 12.5 | 6000 | 29.7 |
| Prior RPS/Argon & RF | 2.6 | 750 | 240 s | 16.8 | 3000 | 57 |
| RPS/Argon | 3.1 | 1000 | 240 s | 16.8 | 4000 | 27 |
| RPS/Helium/RF1 | 2.78 | 625 | 240 s | 16.8 | 2083 | 16 |
| RPS/Helium/RF2 | 2.8 | 750 | 240 s | 16.8 | 2250 | 6 |
| RPS/RF3 | 2.8 | 875 | 250 s | 16.5 | 2650 | 19 |

Table 1 shows a comparison of chamber cleaning results obtained using a prior remote plasma source (prior RPS), such as an Astron® Type AX7650 reactive gas generator from MKS ASTeX® Products of Wilmington, Mass., and a remote plasma source (RPS) and methods described herein, such as a remote plasma source, model number 5707024-F from Advanced Energy Industries, Inc., on a chamber having carbon-doped silicon oxide deposited on its interior surfaces. The RPS/Argon results were obtained using 1000 sccm of $NF_3$, and 1000 sccm of argon. The RPS/Helium/RF1 results were obtained using 625 sccm of $NF_3$, 1250 sccm of helium, and an RF power of 350 Watts. The RPS/Helium/RF2 results were obtained using 750 sccm of $NF_3$, 500 sccm of helium, and an RF power of 350 Watts. The RPS/RF3 results were obtained using an RF power of 200 Watts. The remote plasma source, model number 5707024-F from Advanced Energy Industries, Inc. and processing conditions described in embodiments of the invention yielded a faster cleaning process than the prior remote plasma source, as reflected by the etch rate of the substrate, i.e., the rate at which deposited material is removed from a substrate in a processing region of the chamber during cleaning, the clean time, i.e., the time required to remove 1 $\mu$m of material deposited on the processing region surfaces, and the estimated throughput (wafers per hour (wph)), i.e., the number of substrates that can be processed in the chamber with the chamber cleaning process between the processing of each substrate. Furthermore, the present cleaning methods result in the creation or presence of fewer particles greater than 0.2 $\mu$m than prior cleaning methods. The present cleaning methods also require fewer standard cubic centimeters (scc) of $NF_3$ than prior cleaning methods. The consumption of less $NF_3$ is desirable because of the typically high cost of $NF_3$.

Examples of embodiments will now be described.

EXAMPLE 1

Several hundred sccm of argon was flowed for about two seconds to strike a plasma in two remote plasma sources, model number 5707024-F from Advanced Energy Industries, Inc., connected to a processing region of a Producer® Chamber having experienced a deposition of about 1 $\mu$m of Black Diamond™ film, a silicon oxycarbide film available from Applied Materials, Inc. of Santa Clara, Calif., deposited on a substrate within the chamber. $NF_3$ was also introduced into the remote plasma sources. After the plasma was struck, the remote plasma sources delivered about 6 kilowatts of power to the struck plasma. The plasma included free radicals from the $NF_3$. The $NF_3$ was flowed into a processing region of the deposition chamber at a rate of about 900 sccm. Helium was flowed from a separate gas line into the processing region at a rate of about 500 sccm. A radio frequency power of about 250 Watts was delivered to the processing region. The spacing between the electrodes, i.e., the showerhead and the substrate support member, was about 400 mils. The chamber was cleaned for about 200 seconds. A substrate having Black Diamond™ film deposited on its surface was present in the chamber during cleaning so that the amount of Black Diamond™ film removed from the processing region surfaces could be estimated. Black Diamond™ film was removed from the substrate at a rate of about 3.2 $\mu$m/min.

EXAMPLE 2

Several hundred sccm of argon was flowed for about two seconds to strike a plasma in two remote plasma sources, model number 5707024-F from Advanced Energy Industries, Inc., connected to a processing region of a Producer® Chamber. $NF_3$ was also introduced into the remote plasma sources. After the plasma was struck, the remote plasma sources delivered about 6 kilowatts of power to the struck plasma. The plasma included free radicals from the $NF_3$. The $NF_3$ was flowed into the processing region at a rate of about 900 sccm. Helium was flowed from a separate gas line into the processing region at a rate of about 500 sccm. A radio frequency power of about 250 Watts was delivered to the processing region. The spacing between the electrodes of the processing region of the chamber was about 400 mils. The chamber was cleaned for about 140 seconds. The radio frequency power was terminated. The flow of helium into the deposition chamber was terminated. $NF_3$ was flowed into the processing region from the remote plasma sources at a rate of about 750 sccm. Argon was flowed from the remote plasma sources into the deposition chamber at a rate of about 500 sccm. The spacing was about 260 mils. The chamber was cleaned for about 60 seconds.

While the foregoing is directed to embodiments of the present invention, other and further embodiments of the invention may be devised without departing from the basic scope thereof, and the scope thereof is determined by the claims that follow.

What is claimed is:

1. A method of cleaning a processing region of a deposition chamber, comprising:

introducing a cleaning gas into a remote plasma source connected to the deposition chamber;

striking a plasma in the remote plasma source using a power of about 2 kilowatts or greater;

increasing the power applied by the remote plasma source to the struck plasma to between about 5 kilowatts and about 8 kilowatts, wherein the struck plasma comprises reactive species;

introducing helium into the processing region;
introducing the cleaning gas from the remote plasma source into the processing region; and
delivering radio frequency (RF) power to the processing region.

2. The method of claim 1, wherein the plasma is struck using a power of between about 2 kilowatts and about 3 kilowatts.

3. The method of claim 2, wherein the plasma is struck using a power of about 3 kilowatts.

4. The method of claim 1, wherein the remote plasma source provides about 6 kilowatts of power to the struck plasma.

5. The method of claim 1, wherein the cleaning gas comprises $NF_3$.

6. The method of claim 1, wherein the cleaning gas is flowed into the processing region at a rate of about 250 sccm or greater.

7. The method of claim 6, wherein the cleaning gas is flowed into the processing region at a rate of between about 250 sccm and about 1250 sccm.

8. The method of claim 1, wherein the helium is introduced into the processing region at a rate of between about 125 sccm and about 2500 sccm.

9. The method of claim 1, wherein the radio frequency power is between about 150 watts and about 1000 watts.

10. The method of claim 1, wherein the deposition chamber is a carbon-doped silicon oxide deposition chamber and carbon-doped silicon oxide is removed from interior surfaces of the processing region of the chamber.

11. The method of claim 1, wherein deposited material is removed from interior surfaces of the processing region of the chamber at a rate of between about 2 μm/minute and about 5 μm/minute.

12. The method of claim 1, further comprising introducing argon into the remote plasma source before striking the plasma in the remote plasma source.

13. A method of cleaning a processing region of a deposition chamber, comprising:
introducing a cleaning gas into a remote plasma source connected to the deposition chamber;
striking a plasma in the remote plasma source, wherein the struck plasma comprises reactive species;
introducing the cleaning gas from the remote plasma source into the processing region;
delivering radio frequency (RF) power to the processing region;
terminating the radio frequency power in the processing region, and
flowing the cleaning gas from the remote plasma source into the processing region after terminating the radio frequency power.

14. The method of claim 13, wherein the plasma is struck using a power of between about 2 kilowatts and about 3 kilowatts.

15. The method of claim 14, wherein the plasma is struck using a power of about 3 kilowatts.

16. The method of claim 13, wherein the cleaning gas comprises $NF_3$.

17. The method of claim 13, wherein the cleaning gas is introduced into the processing region at a rate of about 250 sccm or greater.

18. The method of claim 13, wherein the radio frequency power is between about 150 watts and about 1000 watts.

19. The method of claim 13, further comprising introducing helium into the processing region after striking a plasma in the remote plasma source.

20. The method of claim 13, wherein the deposition chamber is a carbon-doped silicon oxide deposition chamber and carbon-doped silicon oxide is removed from interior surfaces of the processing region of the chamber.

21. The method of claim 13, wherein deposited material is removed from interior surfaces of the processing region of the chamber at a rate of between about 2 μm/minute and about 4 μm/minute.

22. The method of claim 13, further comprising introducing argon into the remote plasma source before striking the plasma in the remote plasma source.

23. A method of cleaning a processing region of a deposition chamber, comprising:
introducing a cleaning gas into a remote plasma source connected to the deposition chamber;
striking a plasma in the remote plasma source, wherein the plasma is struck using a cower of about 2 kilowatts or greater in the remote plasma source, the struck plasma comprises reactive species, and wherein the power applied by the remote plasma source to the struck plasma is increased to between about 5 kilowatts and about 8 kilowatts;
introducing the cleaning gas from the remote plasma source into the processing region;
delivering radio frequency (RF) power to the processing region; and
terminating the radio frequency power in the processing region.

24. The method of claim 23, wherein the remote plasma source provides about 6 kilowatts of power to the struck plasma.

25. The method of claim 17, wherein the cleaning gas is introduced into the processing region at a rate of between about 250 sccm and about 2000 sccm.

26. The method of claim 25, wherein the cleaning gas is introduced into the processing region at a rate of between about 250 sccm and about 1250 sccm.

27. The method of claim 19, wherein the helium is introduced into the processing region at a rate of between about 125 sccm and about 2500 sccm.

28. The method of claim 19, wherein the flow of helium into the processing region is terminated after the radio frequency power is terminated.

29. The method of claim 28, further comprising introducing argon into the processing region after the radio frequency power is terminated.

30. The method of claim 29, wherein the cleaning gas is flowed into the processing region at a rate of between about 250 sccm and about 1250 sccm when the argon is introduced into the processing region.

31. The method of claim 30, wherein the argon is introduced into the processing region at a rate of between about 250 sccm and about 2500 sccm.

32. A method of cleaning a processing region of a deposition chamber, comprising:
introducing an inert gas and a cleaning gas into a remote plasma source connected to the deposition chamber;
striking a plasma in the remote plasma source, wherein the struck plasma comprises reactive species, and the plasma is struck using a power of about 2 kilowatts or greater in the remote plasma source;
increasing the power applied by the remote plasma source to the struck plasma to between about 5 kilowatts and about 8 kilowatts;
introducing the cleaning gas from the remote plasma source into the processing region;

introducing helium into the processing region;
delivering radio frequency (RF) power to the processing region;
terminating the radio frequency power in the processing region;
terminating the flow of helium into the processing region; and
introducing argon into the processing region.

* * * * *

UNITED STATES PATENT AND TRADEMARK OFFICE
CERTIFICATE OF CORRECTION

PATENT NO. : 6,902,629 B2 Page 1 of 1
APPLICATION NO. : 10/122481
DATED : June 7, 2005
INVENTOR(S) : Yi Zheng et al.

It is certified that error appears in the above-identified patent and that said Letters Patent is hereby corrected as shown below:

<u>In the Claims</u>

Column 11, Claim 13, Line 49: After "region", change the comma to a semicolon

Column 12, Claim 23, Line 17: Change "cower" to --power--

Signed and Sealed this

Fifth Day of September, 2006

JON W. DUDAS
*Director of the United States Patent and Trademark Office*